United States Patent
Niemann et al.

(10) Patent No.: US 7,498,854 B1
(45) Date of Patent: Mar. 3, 2009

(54) HIGH SPEED SOLID STATE SWITCH

(75) Inventors: James A. Niemann, Aurora, OH (US);
Dan Baker, Medina, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 42 days.

(21) Appl. No.: 11/702,283

(22) Filed: Feb. 5, 2007

(51) Int. Cl.
*H03K 3/00* (2006.01)

(52) U.S. Cl. ............................ 327/108; 327/427

(58) Field of Classification Search ............. 327/108, 327/427
See application file for complete search history.

(56) References Cited

U.S. PATENT DOCUMENTS

| | | | |
|---|---|---|---|
| 6,777,827 B1 * | 8/2004 | Klemt et al. | 307/125 |
| 6,836,161 B2 * | 12/2004 | Akiyama et al. | 327/108 |
| 6,870,405 B2 * | 3/2005 | Visser | 327/108 |

* cited by examiner

*Primary Examiner*—Kenneth B. Wells
(74) *Attorney, Agent, or Firm*—Pearne & Gordon LLP

(57) ABSTRACT

A solid state switch includes a solid state device having an input terminal, an output terminal and a gate terminal; a quick response circuit selectively operable to initially place the solid state device in a conducting state; and a sustained response circuit selectively operable to maintain the solid state device in the conductive state after the quick response circuit. The input terminal and the output terminal are connected when the solid state device is in the conducting state and the input and the output terminal are disconnected when the solid state device is not in the conducting state.

3 Claims, 2 Drawing Sheets

HIGH SPEED SOLID STATE SWITCH

BACKGROUND OF THE INVENTION

The present invention relates to solid state switches and, in particular, to high speed switches useful in precision measurement systems.

It is well-known to use devices such as FETs in solid state substitutes for switching devices such as relays. Often, to isolate control circuitry from the switched signal, opto-isolation is used between the control signals and the switched signal. With settling times in milliseconds, this has allowed for the use of smaller and less expensive solid state switches in place of relays. However, increasingly such settling times are unacceptable in applications such as precision measurements. Instead, sub-microsecond settling times are desired. This allows much more efficient testing in applications such as, for example, semiconductor and electronic device testing.

SUMMARY OF THE INVENTION

A solid state switch includes a solid state device having an input terminal, an output terminal and a gate terminal; a quick response circuit selectively operable to initially place the solid state device in a conducting state; and a sustained response circuit selectively operable to maintain the solid state device in the conductive state after the quick response circuit. The input terminal and the output terminal are connected when the solid state device is in the conducting state and the input and the output terminal are disconnected when the solid state device is not in the conducting state.

DESCRIPTION OF THE PREFERRED EMBODIMENTS

Figure 1:
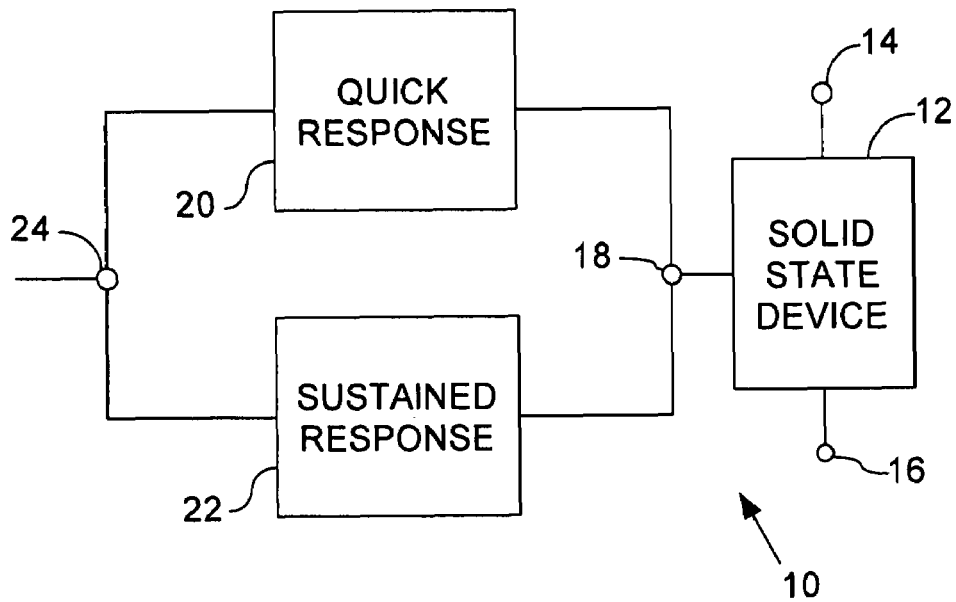
FIG. 1 is a block diagram of an example of the invention.

Referring to FIG. 1, the switch 10 includes a solid state device 12 having an input terminal 14, an output terminal 16 and a gate terminal 18. Voltage on the gate terminal 18 determines the conduction state of the device 12 between the terminals 14, 16. A quick response circuit 20 and a sustained response circuit 22 are connected to the gate terminal 18. A switch selection input 24 is connected to the circuits 20, 22.

In operation, when the selection input is enabled, the circuits 20, 22 are enabled. The quick response circuit 20 initially places the device 12 into a conducting state. Then the sustained response circuit 22 maintains the device 12 in the conducting state. After the sustained response circuit 22 is maintaining the device 12 in the conducting state, the quick response circuit 20 is no longer being used to place the device 12 in the conducting state.

When the selection input 24 is disabled, the circuits 20, 22 are disabled and the device 12 is no longer in the conducting state. The input terminal 14 and the output terminal 16 are connected when the device 12 is in the conducting state and disconnected when the device 12 is not in the conducting state.

Figure 2:
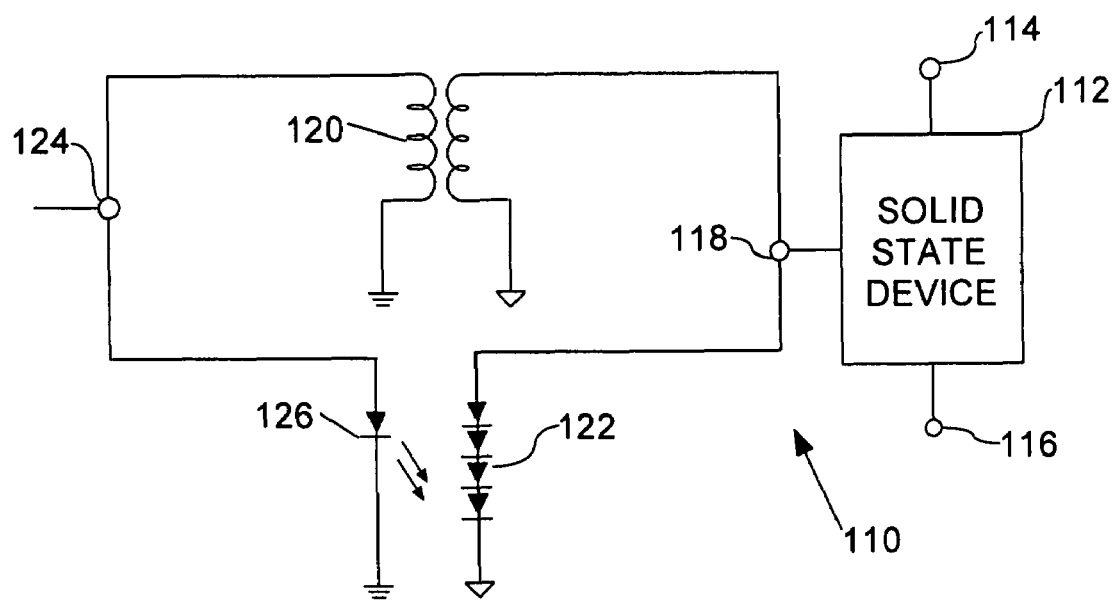
FIG. 2 is a schematic diagram of another example of the invention.

Referring to FIG. 2, a more detailed example of a switch 100 includes a solid state device 112 having an input terminal 114, an output terminal 116 and a gate terminal 118. A pulse transformer 120 and an optical current source 122 are connected to the gate terminal 118. A switch selection input 124 is connected to the circuits 120, 122. In the case of the optical current source 122, the connection is actually to a light source 126, that when activated, illuminates the optical current source 122. The optical current source then effectively functions as a battery as long as it is illuminated.

In operation, when the selection input 124 is enabled, the pulse transformer 120 and the optical current source 122 are enabled. The pulse transformer 120 initially places the device 112 into a conducting state by means of a quick pulse. Then the optical current source 122, which has a more slowly arising output, maintains the device 112 in the conducting state. After the optical current source 122 is maintaining the device 112 in the conducting state, the pulse transformer 120 is no longer being used to place the device 112 in the conducting state, as the transformer does not pass direct current.

When the selection input 124 is disabled, the pulse transformer 120 and the optical current source 122 no longer enabling the device 112 which is no longer in the conducting state. The input terminal 114 and the output terminal 116 are connected when the device 112 is in the conducting state and disconnected when the device 112 is not in the conducting state.

The devices 12, 112 may be, for example, one or more MOSFETs. Multiple MOSFETs in parallel can be used to increase the current handling of the switch. It is also possible to use other solid state devices with similar characteristics. In the case of switching bipolar signals, back-to-back solid state devices may be used with each controlling one polarity of the signal.

The use of devices such as optical current sources and pulse transformers isolates the switching control circuitry from the signals being switched. Other devices with similar characteristics could also be used.

In very high precision measurements, even these techniques can still result in contaminating the signals due to charge injection from the switching control circuitry.

Figure 3:
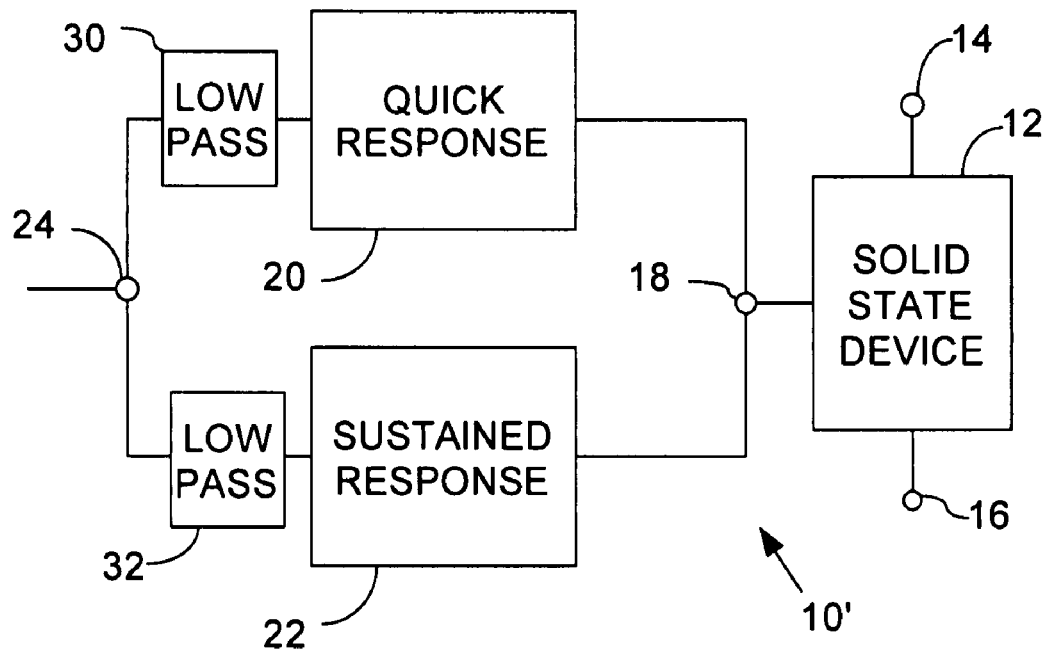
FIG. 3 is a block diagram of still another example of the invention.

Referring to FIG. 3, low pass filters 30, 32 (e.g., RC networks) can be added to the embodiment of FIG. 1. This reduces high speed edges on the control signals that can cause charge injection from the switch.

Figure 4:
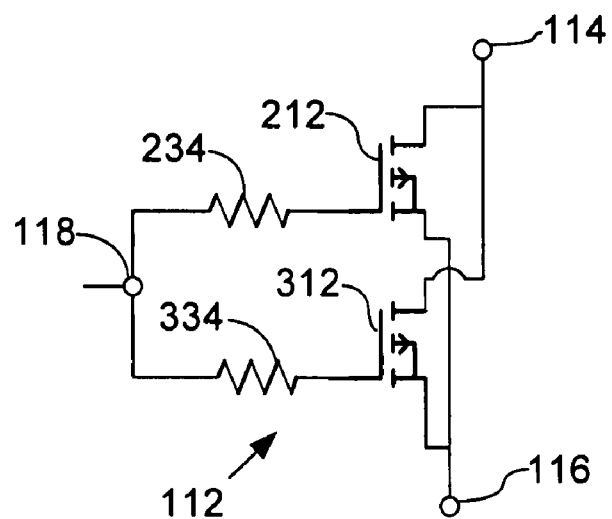
FIG. 4 is a schematic diagram of a portion of an example of the invention.

Referring to FIG. 4, an example of a solid state device 112 includes a device 212 and a device 312 in parallel, except that equal resistors 234, 334 are added to each of the parallel gate terminals. This helps ensure that the devices 212, 312 turn on at the same time. This also helps prevent charge injection from the switch. Other more complex circuitry can also be used to ensure simultaneous turn on.

The combination of a fast response and a sustained response circuit can result in a switch with excellent isolation and sub-microsecond switching speed. Used in precision measurement systems, this allows better measurements in shorter times to be made and eliminates large costly relays.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A solid state switch, said switch comprising:
a solid state device having an input terminal, an output terminal and a gate terminal;
a pulse transformer selectively operable to initially place said solid state device in a conducting state; and
an optical current source selectively operable to maintain said solid state device in said conducting state after said pulse transformer places the solid state device in the conducting state, wherein said input terminal and said output terminal are connected when said solid state device is in said conducting state and said input and said output terminal are disconnected when said solid state device is not in said conducting state.

2. A solid state switch according to claim 1, wherein said selective operation of said pulse transformer is through a low pass filter and said selective operation of said optical current source is through another low pass filter, thereby reducing charge injection from the switch.

3. A solid state switch according to claim 1, wherein said solid state switch comprises multiple said solid state devices in parallel, each having circuitry to ensure said multiple devices are placed in said conducting state at the same time.

* * * * *